(12) United States Patent
Hou et al.

(10) Patent No.: US 10,575,409 B2
(45) Date of Patent: Feb. 25, 2020

(54) FPC FLATTENING JIG AND FPC FLATTENING METHOD

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yongkang Hou, Beijing (CN); Jianlei Yang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 726 days.

(21) Appl. No.: 15/168,797

(22) Filed: May 31, 2016

(65) Prior Publication Data
US 2017/0094807 A1 Mar. 30, 2017

(30) Foreign Application Priority Data

Sep. 28, 2015 (CN) .......................... 2015 1 0629289

(51) Int. Cl.
*B30B 15/34* (2006.01)
*H05K 3/22* (2006.01)
(Continued)

(52) U.S. Cl.
CPC ................ *H05K 3/22* (2013.01); *B30B 1/24* (2013.01); *B30B 15/34* (2013.01); *H05K 3/0014* (2013.01);
(Continued)

(58) Field of Classification Search
CPC . B30B 1/24; B30B 15/34; H05K 3/22; H05K 3/00; H05K 3/0014; H05K 3/225; B29C 65/02
See application file for complete search history.

(56) References Cited

U.S. PATENT DOCUMENTS 2,622,511 A * 12/1952 Marsico .................... B30B 1/24
100/100
2,638,957 A * 5/1953 Danielson ............. B30B 9/3067
100/288
5,065,280 A * 11/1991 Karnezos ............ H01L 23/4006
165/185

FOREIGN PATENT DOCUMENTS

CN          2193374 Y      3/1995
CN      202357518 U      8/2012
(Continued)

OTHER PUBLICATIONS

Office Action dated Jul. 24, 2017 issued in corresponding Chinese Application No. 201510629289.8.

*Primary Examiner* — Jimmy T Nguyen
(74) *Attorney, Agent, or Firm* — Nath, Goldberg & Meyer; Joshua B. Goldberg; Stephanie Majkut

(57) ABSTRACT

A FPC flattening jig and a FPC flattening method. The FPC flattening jig includes a pressurization mechanism and a heating mechanism; a bottom of the pressurization mechanism has a planar base surface which is used to contact a warped FPC to exert pressure thereon; the heating mechanism is used to heat the pressurization mechanism, such that the planar base surface of the pressurization mechanism has a predefined temperature when exerting pressure on the FPC. The FPC flattening jig heats the pressurization mechanism by a heating mechanism, and then the heated planar base surface of the pressurization mechanism contacts the warped FPC and exerts pressure thereon. Therefore, the FPC (Continued)

can be flattened. As such, the FPC can be reused, facilitating the improvement on the recycling rate of FPC.

8 Claims, 2 Drawing Sheets

(51) Int. Cl.
*H05K 3/00* (2006.01)
*B30B 1/24* (2006.01)

(52) U.S. Cl.
CPC ... *H05K 3/225* (2013.01); *H05K 2201/09136* (2013.01); *H05K 2203/0278* (2013.01); *H05K 2203/1105* (2013.01); *H05K 2203/1509* (2013.01)

(56) References Cited

FOREIGN PATENT DOCUMENTS

| CN | 103648238 A | * | 3/2014 |
| CN | 204681682 U | * | 9/2015 |
| JP | 2015-162564 A |  | 9/2015 |

* cited by examiner

FPC FLATTENING JIG AND FPC FLATTENING METHOD

CROSS-REFERENCE TO RELATED APPLICATION

This application claims the priority of Chinese Patent Application No. 201510629289.8 filed on Sep. 28, 2015, titled "FPC flattening jig and FPC flattening method" in the Chinese Intellectual Property Office, the disclosure of which is incorporated herein by reference.

FIELD OF THE INVENTION

The disclosure relates to the field of FPC (Flexible Printed Circuit), and particularly to a FPC flattening jig and a FPC flattening method.

BACKGROUND OF THE INVENTION

Warp may occur in a FPC peeled off from a display panel. As a result, when the peeled-off FPC is recycled, it is not easy to adsorb or grab the FPC. In the meanwhile, the warp on golden fingers of the FPC may lead to a deficiency such as bonding miss. Therefore, in the prior art, recycling rate of FPC is relatively low.

SUMMARY OF THE INVENTION

In order to address at least one of problems in the prior art, the disclosure provides a FPC flattening jig and a FPC flattening method, improving the recycling rate of FPC.

To achieve the objectives of the disclosure, there is provided a FPC flattening jig including a pressurization mechanism and a heating mechanism; a bottom of the pressurization mechanism has a planar base surface which is used to contact a warped FPC to exert pressure on the FPC; and the heating mechanism is used to heat the pressurization mechanism, such that the planar base surface of the pressurization mechanism has a predefined temperature when exerting pressure on the FPC.

Preferably, the FPC flattening jig further includes a drive mechanism which is used to drive the pressurization mechanism 1 to ascend or descend.

Preferably, the drive mechanism includes a motor, a gear wheel and a gear rack, wherein a drive shaft of the motor is connected to the gear wheel, the gear wheel engages with the gear rack, and the pressurization mechanism is fixed to the gear rack.

Preferably, the gear rack is a rigid rod which is formed with teeth for engaging with the gear wheel and which is fixedly connected to the pressurization mechanism at one end.

Preferably, the drive mechanism includes a gear rack, a gear wheel engaged with the gear rack and a turning handle connected to the gear wheel through a connecting shaft; the pressurization mechanism is fixed to the gear rack; and the turning handle is able to rotate the gear wheel, such that the pressurization mechanism fixed to the gear rack ascends or descends therewith.

Preferably, the FPC flattening jig further includes a temperature sensing mechanism which is used to detect the temperature of the pressurization mechanism.

Preferably, the FPC flattening jig further includes a security contact lever which is mounted to the pressurization mechanism and at least a surface of which is made of thermal insulation material.

Preferably, the FPC flattening jig further includes a platform which is used to support the FPC thereon and which is provided underneath the pressurization mechanism.

As another technical scheme, the disclosure also provides a FPC flattening method. The method includes steps of:

S1, placing a FPC on a platform;

S2, heating a pressurization mechanism up to a predefined temperature;

S3, pressing the pressurization mechanism on the FPC for a predefined period of time; and S4, separating the pressurization mechanism from the FPC.

Preferably, the step of placing the FPC on the platform further includes: performing an unfolding process on the FPC.

Preferably, after the step of separating the pressurization mechanism from the FPC, the method further includes:

S5, testing flatness of FPC, wherein if the flatness of FPC is unsatisfied, then return to S3.

Preferably, the pressurization mechanism presses on the FPC for no less than 10 seconds.

Preferably, in the FPC flattening method, a drive mechanism is used to drive the pressurization mechanism to descend to press on the FPC.

Preferably, the pressurization mechanism is provided with a security contact lever on which thermal insulation material is formed; and on the condition that the security contact lever first reaches an operator's hand or arm, then the pressurization mechanism stops descending.

The embodiments of the disclosure may have following advantageous effects:

In the FPC flattening jig according to the disclosure, the pressurization mechanism is heated by the heating mechanism, and then the planar base surface of the pressurization mechanism contacts the warped FPC and exerts pressure thereon. Therefore, the FPC can be flattened. As such, the FPC can be reused, facilitating the improvement on the recycling rate of FPC.

In the FPC flattening method according to the disclosure, the pressurization mechanism is first heated, and then the heated planar base surface of the pressurization mechanism contacts the warped FPC and exerts pressure thereon. Therefore, the FPC can be flattened. As such, the FPC can be reused, facilitating the improvement on the recycling rate of FPC.

BRIEF DESCRIPTION OF THE DRAWINGS

Accompanying drawings are provided for further understanding of this disclosure and constitute a part of the specification. Hereinafter, these drawings are intended to explain the disclosure together with the following specific embodiments, but should not be considered as a limitation of the disclosure. In which.

REFERENCE NUMERAL LIST

1: pressurization mechanism; 2: heating mechanism; 3: drive mechanism; 4: security contact lever; 5: platform; 30: gear wheel; 31: gear rack; 32: turning handle.

DETAILED DESCRIPTION OF THE EMBODIMENTS

The disclosure will be further described in detail in conjunction with the accompanying drawings and specific embodiments. It should be understood that the specific embodiments described herein are provided for the purpose of explanation and illustration of the disclosure but not intended to limit the disclosure.

Figure 1:
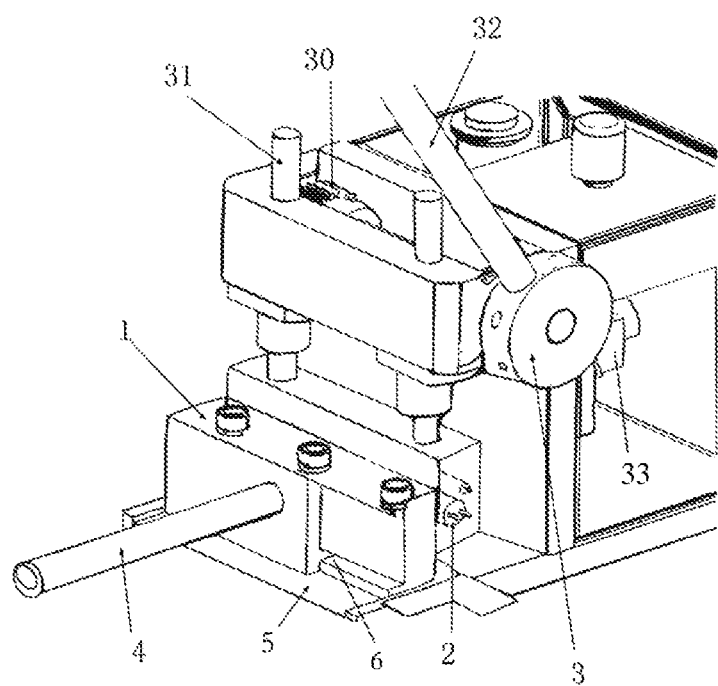
FIG. 1 is a schematic diagram of a FPC flattening jig according to an embodiment of the disclosure.

According to the disclosure, there is provided a FPC flattening jig. FIG. 1 is a schematic diagram of a FPC flattening jig according to an embodiment of the disclosure. As shown in FIG. 1, in the embodiment of the disclosure, the FPC flattening jig may include a pressurization mechanism 1 (for example, pressing block) and a heating mechanism 2 (for example, heating rod); a bottom of the pressurization mechanism 1 has a planar base surface which is used to contact a warped FPC to exert pressure on the FPC; and the heating mechanism 2 is used to heat the pressurization mechanism 1, such that the planar base surface of the pressurization mechanism 1 has a predefined temperature when exerting pressure on the FPC. In addition, the FPC flattening jig may further include a platform 5 which is used to place or support FPC thereon and which is provided underneath the pressurization mechanism 1.

In this embodiment, when the warped FPC is being flattened, the FPC is placed on the platform 5. The heating mechanism 2 firstly heats the pressurization mechanism 1 up to the predefined temperature. In particular, the planar base surface of the pressurization mechanism 1 is heated up to the predefined temperature. Then, the planar base surface of the pressurization mechanism 1 is brought into contact with the warped FPC placed on the platform 5. Under the action of gravity of the pressurization mechanism 1, the warped FPC can be kept in a flattened state. While the planar base surface of the pressurization mechanism 1 is contacted with the warped FPC, heat of the pressurization mechanism 1 can be transferred to the FPC, such that the flattened state of the FPC is fixed. Therefore, when the pressurization mechanism 1 is removed from the FPC, the FPC can still be kept flattened rather than warped. This may assist in reusing the FPC, thereby improving the recycling rate of FPC.

The FPC flattening jig may further include a drive mechanism 3 which is used to drive the pressurization mechanism 1 to ascend or descend. When the warped FPC is to be flattened, the drive mechanism 3 can drive the pressurization mechanism 1 to descend, such that the heated pressurization mechanism 1 falls down to the platform 5 on which the warped FPC is placed and exerts pressure on the FPC; after the FPC is flattened, the drive mechanism 3 can drive the pressurization mechanism 1 to ascend, such that the pressurization mechanism 1 is separated from the FPC.

In particular, the drive mechanism 3 may include a gear rack 31, a gear wheel 30 engaged with the gear rack 31 and a turning handle 32 connected to the gear wheel 30 through a connecting shaft; the pressurization mechanism 1 is fixed to the gear rack 31; and the turning handle 32 is able to rotate the gear wheel 30, such that the pressurization mechanism 1 fixed to the gear rack 31 ascends or descends therewith. When the pressurization mechanism 1 is driven to ascend or descend, an operator may manually rotate the turning handle 32, so as to drive the pressurization mechanism 1 fixed to the gear rack 31 to ascend or descend by a gear-rack mechanism formed by the gear wheel 30 and the gear rack 31.

Preferably, as shown in FIG. 1, the gear rack 31 is a rigid rod which is formed with teeth for engaging with the gear wheel 30 and which is fixedly connected to the pressurization mechanism 1 at one end.

The drive mechanism 3 may also be formed as other structures. For example, the drive mechanism 3 may particularly include a motor, a gear wheel 30 and a gear rack 31, wherein a drive shaft of the motor is connected to the gear wheel 30, the gear wheel 30 engages with the gear rack 31, and the pressurization mechanism 1 is fixed to the gear rack 31.

The drive mechanism 3 may also be formed as other structures. For example, the drive mechanism 3 may particularly include a motor 33, a gear wheel 30 and a gear rack 31, wherein a drive shaft of the motor 33 is connected to the gear wheel 30, the gear wheel 30 engages with the gear rack 31, and the pressurization mechanism 1 is fixed to the gear rack 31.

Preferably, the FPC flattening jig may further include a temperature sensing mechanism 6 which is used to detect the temperature of the pressurization mechanism 1. In practice, the temperature sensing mechanism 6 may be used to detect whether the pressurization mechanism 1 is heated to the predefined temperature, thereby facilitating subsequent operations. For example, when the temperature sensing mechanism detects that the pressurization mechanism 1 is heated to the predefined temperature, the pressurization mechanism 1 may be stopped from being heated. On the condition that the pressurization mechanism 1 is heated to the predefined temperature, the planar base surface of the pressurization mechanism 1 is brought into contact with the FPC.

Preferably, the platform 5 may also be provided with a heating mechanism (not shown), such that the FPC can be heated when the FPC is interposed between the planar base surface of the pressurization mechanism 1 and the platform 5. In such a case, the pressed FPC can be made more flat and uniform.

In can be understood that when the warped FPC is being flattened, it is necessary for the operator to press and hold the FPC (and release before the pressurization mechanism 1 is contacted with the FPC), in order to ensure that the FPC can be pressed into a planar form rather than a folded form. However, when the operator presses and holds the FPC, the pressurization mechanism 1 in a descending state is likely to contact the operator's hand or arm. Since the planar base surface of the pressurization mechanism 1 has normally been heated to a relatively high temperature, the operator's hand or arm may get wounded due to the pressure or the high temperature. In this embodiment, preferably, the FPC flattening jig may further include a security contact lever 4 which is mounted to the pressurization mechanism 1 and at least a surface of which is made of thermal insulation material. In such a manner, before the planar base surface of the pressurization mechanism 1 reaches the operator's hand or arm, the security contact lever 4 may first contact the operator's hand or arm, thereby avoiding that the operator's hand or arm gets wounded due to the high temperature.

In the FPC flattening jig according to the disclosure, the pressurization mechanism is heated by the heating mechanism 2, and then the planar base surface of the pressurization mechanism 1 contacts the warped FPC and exerts pressure thereon. Therefore, the FPC can be flattened. As such, the FPC can be reused, facilitating the improvement on the recycling rate of FPC.

Figure 2:
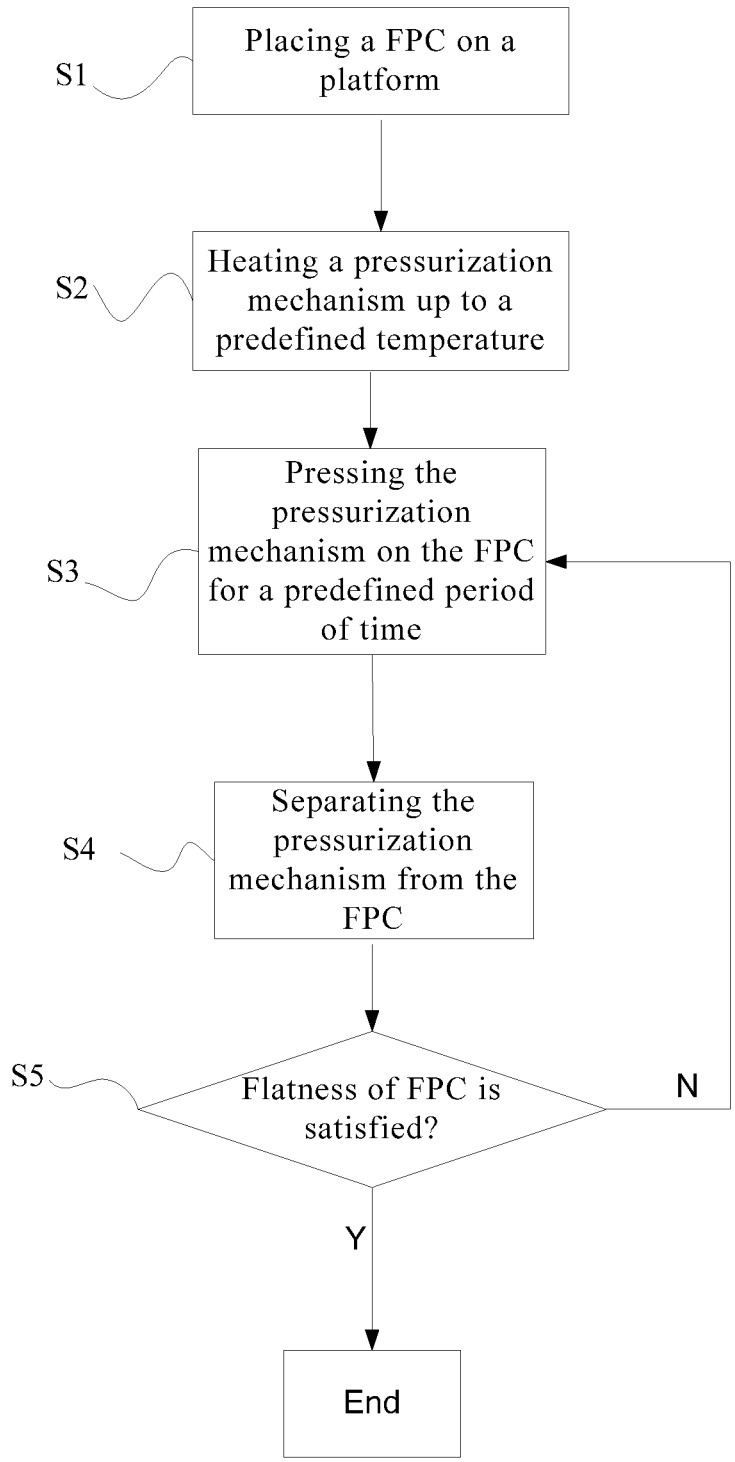
FIG. 2 is a flow chart of a FPC flattening method according to an embodiment of the disclosure.

According to the disclosure, there is also provided a FPC flattening method. FIG. 2 is a flow chart of a FPC flattening method according to an embodiment of the disclosure. As shown in FIG. 2, the FPC flattening method may include following Steps S1-S4.

S1, placing a FPC on a platform.

At Step S1, the warped FPC is placed on the platform, and preferably an unfolding process is performed on the FPC to prevent an excessive warp angle of FPC. If the warp angle of FPC is excessive, then the FPC may be pressed into a folded form.

S2, heating a pressurization mechanism up to a predefined temperature.

S3, pressing the pressurization mechanism on the FPC for a predefined period of time.

In particular, a drive mechanism can be used to drive the pressurization mechanism to descend to press on the FPC. Normally, the pressurization mechanism presses on the FPC for no less than 10 seconds.

S4, separating the pressurization mechanism from the FPC.

In addition, after the step of separating the pressurization mechanism from the FPC, the FPC flattening method may further include:

S5, testing flatness of FPC, wherein if the flatness of FPC is unsatisfied, then return to S3.

In this embodiment, the pressurization mechanism may be provided with a security contact lever in the FPC flattening jig as described above. In the process of flattening the FPC, if the security contact lever first reaches the operator's hand or arm, then the pressurization mechanism may stop descending, thereby avoiding that the operator's hand or arm gets wounded due to the pressure or the high temperature.

In the FPC flattening method according to the disclosure, the pressurization mechanism is first heated, and then the heated planar base surface of the pressurization mechanism contacts the warped FPC and exerts pressure thereon. Therefore, the FPC can be flattened. As such, the FPC can be reused, facilitating the improvement on the recycling rate of FPC.

It should be understood that the above embodiments are merely exemplary embodiments for the purpose of illustrating the principle of the invention, and the invention is not limited thereto. Various modifications and improvements can be made by a person having ordinary skill in the art without departing from the spirit and the essence of the invention. Accordingly, all of the modifications and improvements also fall into the protection scope of the invention.

The invention claimed is:

1. A Flexible Printed Circuit (FPC) flattening jig comprising:
a pressurization mechanism and a heating mechanism;
wherein a bottom of the pressurization mechanism has a planar base surface which is used to contact a warped Flexible Printed Circuit (FPC) to exert pressure on the Flexible Printed Circuit (FPC);
the heating mechanism is used to heat the pressurization mechanism, such that the planar base surface of the pressurization mechanism has a predefined temperature when exerting pressure on the Flexible Printed Circuit (FPC); and
the Flexible Printed Circuit (FPC) flattening jig further includes a security contact lever which is mounted directly to the pressurization mechanism and at least a surface of which is made of thermal insulation material and the security contact lever is configured to first contact a hand or arm of an operator before the planar base surface of the pressurization mechanism reaches the hand or arm.

2. The Flexible Printed Circuit (FPC) flattening jig according to claim 1, wherein the Flexible Printed Circuit (FPC) flattening jig further includes a drive mechanism which is used to drive the pressurization mechanism to ascend or descend.

3. The Flexible Printed Circuit (FPC) flattening jig according to claim 2, wherein the drive mechanism includes a motor, a gear wheel and a gear rack, wherein a drive shaft of the motor is connected to the gear wheel, the gear wheel engages with the gear rack, and the pressurization mechanism is fixed to the gear rack.

4. The Flexible Printed Circuit (FPC) flattening jig according to claim 3, wherein the gear rack is a rigid rod which is formed with teeth for engaging with the gear wheel and which is fixedly connected to the pressurization mechanism at one end.

5. The Flexible Printed Circuit (FPC) flattening jig according to claim 2, wherein the drive mechanism includes a gear rack, a gear wheel engaged with the gear rack and a turning handle connected to the gear wheel through a connecting shaft;
the pressurization mechanism is fixed to the gear rack; and
the turning handle is able to rotate the gear wheel, such that the pressurization mechanism fixed to the gear rack ascends or descends therewith.

6. The Flexible Printed Circuit (FPC) flattening jig according to claim 5, wherein the gear rack is a rigid rod which is formed with teeth for engaging with the gear wheel and which is fixedly connected to the pressurization mechanism at one end.

7. The Flexible Printed Circuit (FPC) flattening jig according to claim 1, wherein the Flexible Printed Circuit (FPC) flattening jig further includes a temperature sensing mechanism which is used to detect the temperature of the pressurization mechanism.

8. The Flexible Printed Circuit (FPC) flattening jig according to claim 1, wherein the Flexible Printed Circuit (FPC) flattening jig further includes a platform which is used to support the Flexible Printed Circuit (FPC) thereon and which is provided underneath the pressurization mechanism.

* * * * *